US007271593B2

(12) United States Patent
Junginger et al.

(10) Patent No.: US 7,271,593 B2
(45) Date of Patent: Sep. 18, 2007

(54) CONTACTLESS SYSTEM AND METHOD FOR DETECTING DEFECTIVE POINTS ON A CHARGEABLE SURFACE

(75) Inventors: Johann E. Junginger, Toronto (CA); Zoran D. Popovic, Mississauga (CA); Surendar Jeyadev, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 11/247,576

(22) Filed: Oct. 11, 2005

(65) Prior Publication Data

US 2007/0080693 A1 Apr. 12, 2007

(51) Int. Cl.
*G01N 27/60* (2006.01)
*G01R 29/12* (2006.01)

(52) U.S. Cl. ...................................... 324/456; 324/457

(58) Field of Classification Search ................ 324/456, 324/457, 455

See application file for complete search history.

(56) References Cited

U.S. PATENT DOCUMENTS 3,898,001 A * 8/1975 Hardenbrook et al. ........ 399/73
5,119,030 A * 6/1992 Bossard et al. ............. 324/456
5,504,556 A * 4/1996 Umeda et al. ................. 399/9
5,703,487 A * 12/1997 Mishra ....................... 324/456
6,008,653 A 12/1999 Popovic et al.
6,119,536 A 9/2000 Popovic et al.
6,469,513 B1 * 10/2002 Tse ............................ 324/455

* cited by examiner

*Primary Examiner*—Anjan Deb
*Assistant Examiner*—Jeff Natalini
(74) *Attorney, Agent, or Firm*—Carter DeLuca Farrell & Schmidt, LLP

(57) ABSTRACT

A method for detecting charge defect spots (CDSs) on a chargeable surface is provided, including charging the chargeable surface to receive and hold a first voltage charge, spacing a surface of a scanner probe a distance from the chargeable surface, the scanner probe having a diameter, and biasing the scanner probe to a second voltage charge within a predetermined voltage threshold of the first voltage charge, wherein a parallel plate capacitor is established with the chargeable surface and a dielectric substance between the scanner probe and the chargeable surface. The method further includes reading with the scanner probe potentials associated with charges induced from the applied charges and any CDSs on the chargeable surface, including sensing the potentials and generating a signal corresponding to the sensing, applying a reference charge to the chargeable surface, and determining the potential of a CDS on the chargeable surface based on the scanner probe readings and at least one of the applied charges, which includes correcting for non-uniform charge distribution caused by a point-like nature of the CDS on the chargeable surface.

19 Claims, 6 Drawing Sheets

FIG. 4
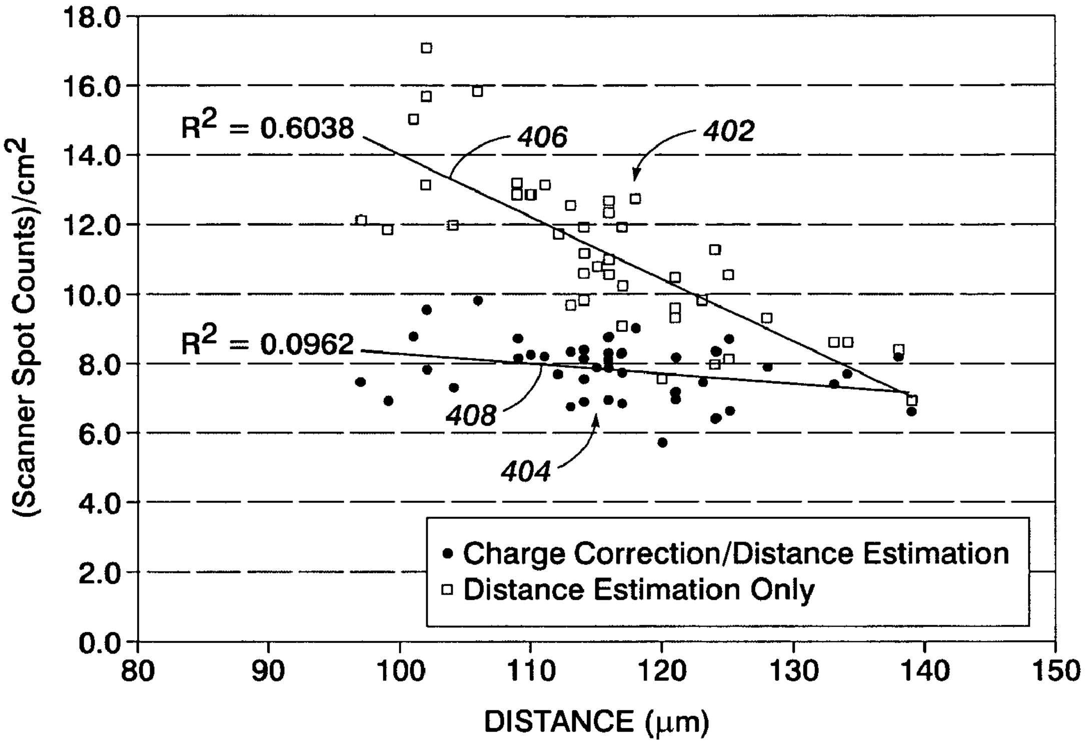
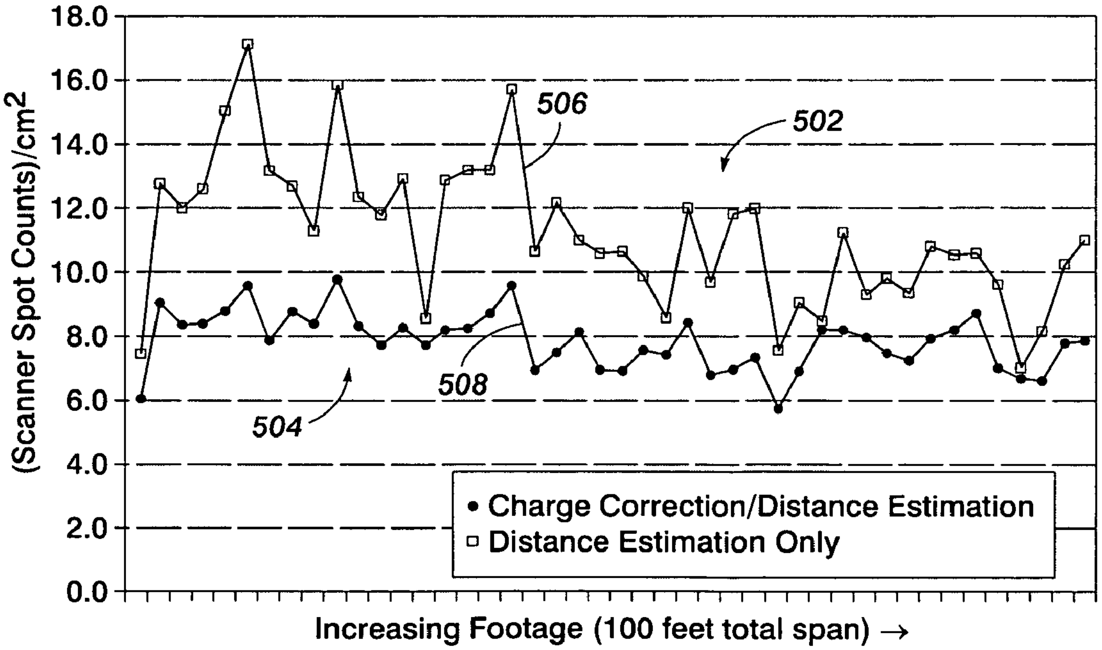
FIG. 5

FIG. 8
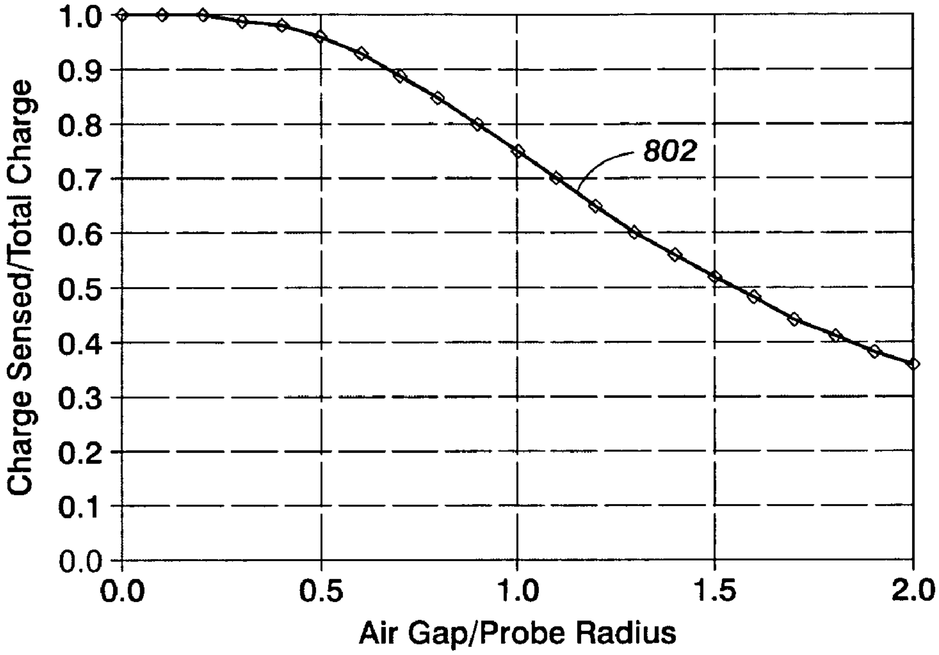
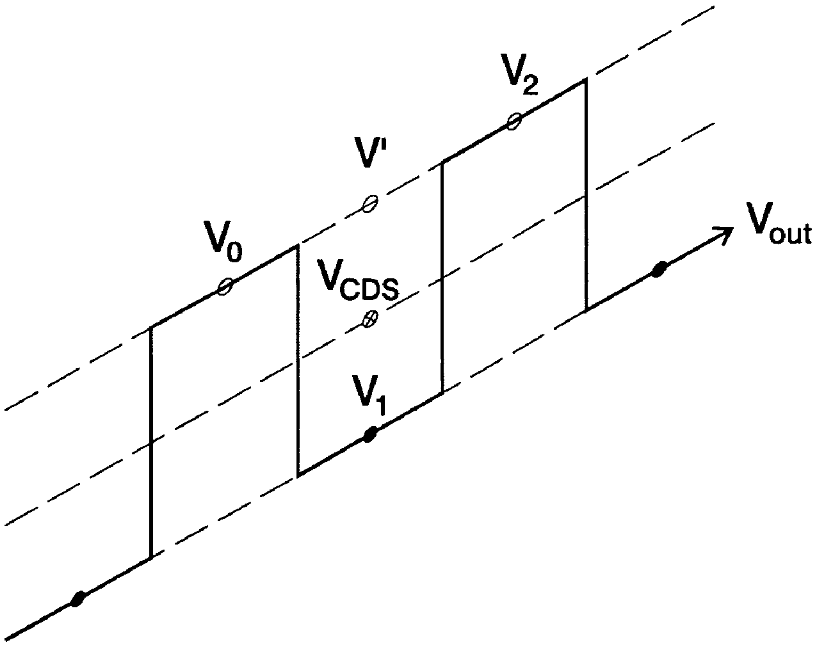
FIG. 9

CONTACTLESS SYSTEM AND METHOD FOR DETECTING DEFECTIVE POINTS ON A CHARGEABLE SURFACE

BACKGROUND

This disclosure relates generally to a scanning system for detecting defects in a chargeable surface. More particularly, this disclosure relates to a contactless system and method for detecting defective points on a chargeable surface.

Although the concept of this disclosure includes any type of system for constant distance, contactless scanning of chargeable surfaces used in diverse applications, such as charge sensing probes for xerography, print heads for ink jet printing, ion stream heads for ionography, extrusion dies for coating, LED image exposure bars, and the like, the following discussion is directed to prior art systems for scanning chargeable surfaces used in xerography for illustrative purposes.

In the art of xerography, a xerographic plate or photoreceptor having a photoconductive insulating layer is provided. An image is acquired by first uniformly depositing an electrostatic charge on the imaging surface of the xerographic plate and then exposing the plate to a pattern of activating electromagnetic radiation, such as light, which selectively dissipates the charge in the illuminated areas of the plate while leaving behind an electrostatic latent image in the non-illuminated areas. This electrostatic latent image may then be developed to form a visible image by depositing finely divided electroscopic marking particles on the imaging surface.

A photoconductive layer for use in xerography may be a homogeneous layer of a single material such as vitreous selenium, or it may be a composite layer containing a photoconductor and another material. One type of composite photoconductive layer used in electrophotography is described in U.S. Pat. No. 4,265,990, the entire disclosure thereof being incorporated herein by reference. The patent describes a photosensitive member having at least two electrically operative layers. One layer comprises a photoconductive layer which is capable of photo-generating holes and injecting the photogenerated holes into a contiguous charge transport layer. Generally, where the two electrically operative layers are positioned on an electrically conductive layer with the photoconductive layer sandwiched between a contiguous charge transport layer and the conductive layer, the outer surface of the charge transport layer is normally charged with a uniform electrostatic charge, and the conductive layer is utilized as an electrode. In flexible electrophotographic imaging members, the electrode is normally a thin conductive coating supported on a thermoplastic resin web.

The conductive layer may also function as an electrode when the charge transport layer is sandwiched between the conductive layer and a photoconductive layer which is capable of photogenerating electrons and injecting the photogenerated electrons into the charge transport layer. The charge transport layer in this embodiment must be capable of supporting the injection of photogenerated electrons from the photoconductive layer and transporting the electrons through the charge transport layer.

The photoreceptors are usually multilayered and comprise a substrate, an optional conductive layer (if the substrate is not itself conductive), an optional hole blocking layer, an optional adhesive layer, a charge generating layer, and a charge transport layer and, in some belt embodiments, an anti-curl backing layer.

In a photoreceptor, many types of microdefects can be a source of xerographic image degradation. These microdefects can be occlusions of particles, bubbles in the coating layers, microscopic areas in the photoreceptor without a charge generator layer, coating thickness non-uniformities, dark decay non-uniformities, light sensitivity non-uniformities, and charge deficient spots (CDSs). These last types of defect, charge deficient spots (CDSs) are localized areas of discharge without activation by light. They can cause two types of image defects, depending on the development method utilized. Charge deficient spots usually can be detected electrically or by xerographic development. They typically elude microscopic or chemical detection.

In discharged area development, the photoreceptor is negatively charged. An electrostatic latent image, as a charge distribution, is formed on the photoreceptor by selectively discharging certain areas. Toner attracted to discharged areas develops this latent image. Laser printers usually work on this principle. When charge deficient spots are present on the photoreceptor, examination of the final image after toner transfer form the photoreceptor to a receiving member, such as paper, reveals dark spots on a white background due to the absence of negative charge in the charge deficient spots.

In charged area development, usually used in light lens xerography, the toner image is formed by developing the charged areas on a photoreceptor. After transfer of the toner image to a receiving member, such as paper, the charge deficient spot on the photoreceptor results in a small white spot in a black background called a microwhite, which is not as noticeable as a "microblack" spot, characteristic of discharged area development.

One technique for detecting charge deficient spots in photoreceptors from a specific production run is to cycle the photoreceptor in the specific type of copier, duplicator and printer machine for which the photoreceptor was fabricated. Generally, it has been found that actual machine testing provides the most accurate way of detecting charge deficient spots in a photoreceptor from a given batch.

However, machine testing for detecting charge deficient spots is a laborious and time consuming process involving hand feeding of sheets by test personnel along with constant monitoring of the final quality of every sheet. Moreover, accuracy of the test results depends a great deal upon interpretations and behavior of the personnel that are feeding and evaluating the sheets.

Further, since machine characteristics vary from machine to machine for any given model or type, reliability of the final test results for any given machine model must factor in peculiar quirks of that specific machine versus the characteristics of other machines of the same model or type. Because of machine complexity and variations from machine to machine, the data from a test in a single machine is not sufficiently credible to justify the scrapping of an entire production batch of photoreceptor material.

Thus, tests are normally conducted in three or more machines. Since a given photoreceptor may be used in different kinds of machines such as copiers, duplicator and printers under markedly different operating conditions, the charge deficient spots detection based on the machine tests of a representative test photoreceptor sample is specific to the actual machine in which photoreceptors from the tested batch will eventually be utilized. Thus, photoreceptor tests on one machine do not necessarily predict whether the appearance of charge deficient spots occur if the same type of photoreceptor were used in a different type of machine.

Thus, for a machine charge deficient spot test, the test would have to be conducted on each different type of machine. This becomes extremely expensive and time consuming. Moreover, because of the length of time required for machine testing, the inventory of stockpiled photoreceptors waiting approval based on life testing of machines can reach unacceptably high levels. For example, a batch may consist of many rolls, with each roll yielding thousands of belts.

Another test method utilizes a stylus scanner such as that described by Z. D. Popovic et al., "Characterization of Microscopic Electrical Defects in Xerographic Photoreceptors", Journal of Imaging Technology, vol. 17, No. 2, April/May, 1991, pp. 71-75. The stylus scanner applies a bias voltage to a shielded probe, which is immersed in silicone oil and is in contact with the photoreceptor surface. The silicone oil prevents electrical arcing and breakdown. Current flowing through the probe contains information about defects, and scanning speeds up to 6×6 $mm^2$ in about 15 minutes were achieved. Although the stylus scanner is a highly reproducible tool which enabled some important discoveries about the nature of charge deficient spots, it has the basic shortcoming of low speed.

Many attempts have also been made in the past to reduce the time of scan by designing contactless probes. For example, a probe has been described in the literature and used for readout of xeroradiographic (X-ray) amorphous selenium plates, (see, e.g., W. Hillen, St. Rupp, U. Schieble, T. Zaengel, Proc. SPIE, Vol. 1090, Medical Imaging III, Image Formation, 296 (1989); W. Hillen, U. Schieble, T. Zaengel, Proc. SPIE, Vol. 914, Medical Imaging II, 253 (1988); U. Schieble, W. Hillen, T. Zaengel, Proc. SPIE, Vol. 914, Medical Imaging II, 253 (1988); and U. Schieble, T. Zaemge, Proc. SPIE, Vol. 626, Medicine XIV/PACS IV, 86 (1986)). These probes rely on reducing the distance of a probe to a photoreceptor surface in order to increase resolution of the measurements. The typical distance of the probe to the photoreceptor surface is 50-150 micrometers. In order to avoid air breakdown, the ground plane of a xeroradiographic plate is biased appropriately to provide approximately zero voltage difference between the probe and photoreceptor surface.

In U.S. Pat. Nos. 6,008,653 and 6,119,536, the contents of both of which are incorporated herein by reference in their entirety, a contactless system and method for scanning a photoreceptor surface is described. In U.S. Pat. No. 6,008,653, entitled CONTACTLESS SYSTEM FOR DETECTING MICRODEFECTS ON ELECTROSTATOGRAPHIC MEMBERS, a contactless process is disclosed for detecting surface potential charge patterns in an electrophotographic imaging member, including applying a constant voltage charge to an imaging surface of a photoreceptor, and biasing a capacitive scanner probe having an outer shield electrode to within about ±300 volts of the average surface potential of the imaging surface. The probe is maintained adjacent to and spaced from the imaging surface to form a parallel plate capacitor with a gas between the probe and the imaging surface. Relative movement is established between the probe and the imaging surface, maintaining a substantially constant distance between the probe and the imaging surface. The probe is synchronously biased and variations in surface potential are measured with the probe. The surface potential variations are compensated for variations in distance between the probe and the imaging surface, and the compensated voltage values are compared to a baseline voltage value to detect charge patterns in the imaging member.

The process described in U.S. Pat. No. 6,008,653 is implemented using a system for maintaining a substantially constant distance between the probe and the imaging surface. This system is described in U.S. Pat. No. 6,119,536, entitled CONSTANT DISTANCE SCANNER PROBE SYSTEM. While ideally the distance between the probe and the imaging surface is maintained constant while scanning the imaging surface, in reality small variations do occur. An algorithm is provided for compensating for variation in the distance between the probe and the imaging surface. The algorithm is based on compensation for a flat plate capacitor in which charge is uniformly distributed. However, defects such as CDSs are small points. The point-like nature of the CDSs affects the charge distribution to be non-uniform, and the distance compensation algorithm currently used is not sufficient in correcting for the non-uniform charge distribution caused by the point-like nature of CDSs on the imaging surface.

Thus, there is a need for a system and method for correcting for the non-uniform charge distribution caused by the point-like nature of CDSs on the chargeable surface in conjunction with a scan operation of the chargeable surface.

SUMMARY

In accordance with one aspect of the present disclosure there is provided a contactless system for detecting charge defect spots (CDSs) on a chargeable surface. The system includes first circuitry for charging the chargeable surface to receive and hold a first voltage charge; a scanner probe having a probe surface, the probe surface being displaced a distance from the chargeable surface, and having a diameter, and second circuitry for biasing the scanner probe to a second voltage charge within a predetermined voltage threshold of the first voltage charge. A parallel plate capacitor is established with the chargeable surface and a dielectric substance between the scanner probe surface and the chargeable surface, wherein the scanner probe reads potentials associated with charges induced from the applied charges and any CDSs on the chargeable surface, including sensing the potentials and generating a signal corresponding to the sensing. The system further includes a third circuitry for applying a reference charge to at least one of the scanner probe and the chargeable surface, a processor, and a charge determination module. The charge determination module includes programmable instructions executable by the processor for determining the potential of a CDS on the chargeable surface based on the scanner probe readings and at least one of the applied charges, including correcting for a non-uniform charge distribution caused by a point-like nature of the CDS on the chargeable surface.

Pursuant to another aspect of the present disclosure, a method for detecting charge defect spots (CDSs) on a chargeable surface is provided. The method includes charging the chargeable surface to receive and hold a first voltage charge, spacing a surface of a scanner probe a distance from the chargeable surface, the scanner probe having a diameter, and biasing the scanner probe to a second voltage charge within a predetermined voltage threshold of the first voltage charge, wherein a parallel plate capacitor is established with the chargeable surface and a dielectric substance between the scanner probe surface and the chargeable surface. The method further includes reading with the scanner probe potentials associated with charges induced from the applied charges and any CDSs on the chargeable surface, including sensing the potentials and generating a signal corresponding to the sensing, applying a reference charge to at least one of the scanner probe and the chargeable surface; and determining the potential of a CDS on the chargeable surface based on the scanner probe readings and at least one of the applied charges. Determining the potential includes correcting for a non-uniform charge distribution caused by a point-like nature of the CDS on the chargeable surface.

Pursuant to yet another aspect of the present disclosure, a contactless scanning system is provided for detecting charge defect spots (CDSs) on a photoreceptor. The system includes a first circuitry for charging the photoreceptor to receive and hold a first voltage charge; a scanner probe having a probe surface, the probe surface being displaced a distance from the chargeable surface, and having a diameter; and second circuitry for biasing the scanner probe to a second voltage charge within a predetermined voltage threshold of the first voltage charge. A parallel plate capacitor is established with the photoreceptor and a dielectric substance between the scanner probe surface and the photoreceptor, wherein the scanner probe reads potentials associated with charges induced from the applied charges and any CDSs on the photoreceptor, including sensing the potentials and generating a signal corresponding to the sensing. The system further includes third circuitry for applying a reference charge to at least one of the scanner probe and the photoreceptor; a processor; and a charge determination module. The charge determination module includes programmable instructions executable by the processor for determining the potential of a CDS on the photoreceptor based on the scanner probe readings and at least one of the applied charges, including correcting for a non-uniform charge distribution caused by a point-like nature of CDSs on the photoreceptor.

BRIEF DESCRIPTION OF THE DRAWINGS

Various embodiments of the present disclosure will be described herein below with reference to the figures wherein:

FIG. 4 is a plot of experimentally determined scanner spot counts plotted for variations in gap distance between the scanner probe and a photoreceptor scanned, including scanner spot counts plotted using charge correction in accordance with the present disclosure as compared to scanner spot counts plotted without charge correction;

FIG. 5 is a plot of experimentally determined scanner spot counts plotted for various positions along a length of a photoreceptor relative to a starting position on the photoreceptor scanned, including scanner spot counts plotted using charge correction in accordance with the present disclosure as compared to scanner spot counts plotted without charge correction;

FIG. 8 is a charge correction curve in accordance with the present disclosure; and FIG. 9 is a schematic diagram of probe reading signals.

DETAILED DESCRIPTION

A scanning system is provided for scanning a chargeable surface for charge deficient spots (CDSs). The chargeable surface is charged to a first potential, and a scanner probe is charged to a second potential within a predetermined potential of the first potential. Additionally, a reference wave is applied to at least one of the scanner probe and the chargeable surface. The scanner probe reads or measures potential associated with charges induced from the applied charges and any CDSs on the chargeable surface. A processor processes the probe measurements (also referred to as readings) for determining the potential of a CDS on the chargeable surface based on the scanner probe readings and at least one of the applied charges, including adjusting the determining of the potential of the CDS based on the distance from a surface of the probe to the chargeable surface for accounting for a point-like nature of the CDS.

The present disclosure is directed at contactless scanning of any type of chargeable surface, such as chargeable surfaces used in applications such as xerography, ink jet printing, ionography, extrusion dies for coating, LED imaging. The following description concentrates on scanning of an imaging surface of a photoreceptor used in xerography for illustrative purposes, however the scope of the present disclosure is not limited to scanning thereof, but may be applied to scanning of other chargeable surfaces used in other applications.

Figure 1:
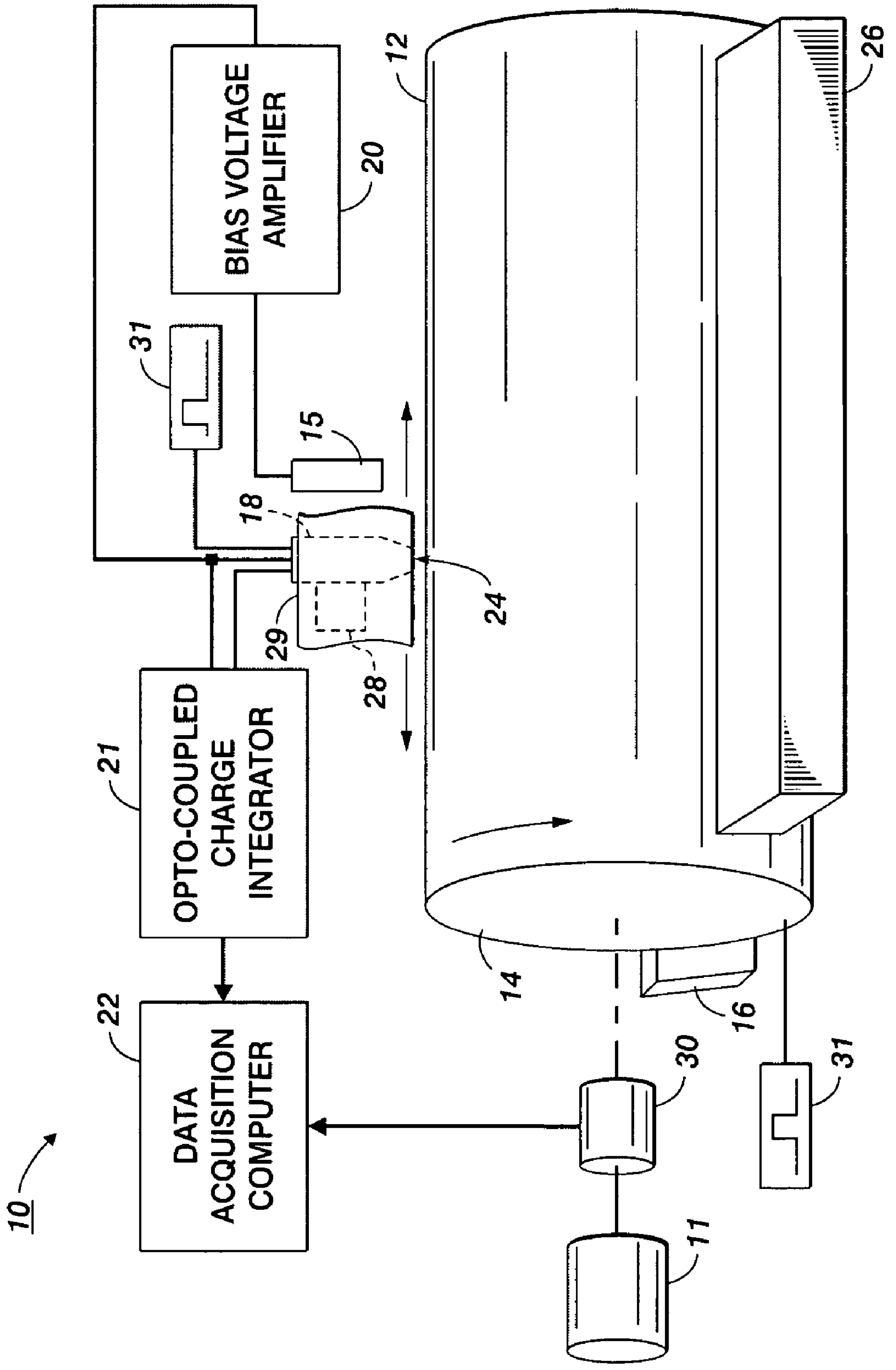
FIG. 1 is a schematic illustration of an embodiment of a scanner system in accordance with the present disclosure.

For a general understanding of the features of the present disclosure, reference is made to the drawings. In the drawings, like reference numerals have been used throughout to identify identical elements. With reference to FIG. 1, an exemplary scanner system 10 is shown including an electrically conductive and isolated drum 14 that is rotated at constant speed by a stepper motor 11. Similar to a xerographic imaging system, a chargeable surface embodied as a flexible photoreceptor 12 (which may be formed as a photoreceptor belt) is mounted on drum 14, and charged via a charging device 16, such as a scorotron which electrostatically charges the photoreceptor 12 to a constant voltage. The photoreceptor 12 is provided with a conductive bottom plate functioning as a ground plane to which the charge is applied. Alternatively, the drum 14 may be a photoreceptor drum substrate coated with at least one electrophotographic coating functioning as the photoreceptor 12.

The system 10 further includes an electrostatic voltmeter probe 15, bias voltage amplifier 20, high resolution scanner probe 18, distance control system 29, charge integrator 21 (which may be optically coupled), data acquisition computer 22, stepping actuator combination 28, encoder 30, and at least one wave generator 31. The electrostatic probe 15 and bias voltage amplifier 20 are provided for biasing the scanner probe 18 to within a threshold potential difference from an average surface potential of photoreceptor 12. In one embodiment of the disclosure, the electrostatic probe 15 is a low spatial resolution electrostatic voltmeter which does not sense defects as small as charge deficient spots.

During scanning, the scanner probe 18, charge integrator 21 and data acquisition computer 22 measure changes in the potential of the photoreceptor 12 after charging. Measurements are obtained by applying a pulse from encoder 30 at a constant angular position. The encoder ensures a spatial registration of probe readings by the scanner probe 18 for forming an accurate map of the surface of the photoreceptor by supplying a once-per revolution pulse, such as a transistor-transistor logic (TTL) pulse which acts as a trigger for data acquisition of individual scan lines. The data acquisition corresponds to an A/D conversion process which operates on a system clock, as described further below. The distance control system 29 controls the distance or gap between the scanner probe 18 and the surface being scanned (also referred to throughout the disclosure as the gap distance), e.g., the surface of the photoreceptor 12. The at least one wave generator 31 applies a reference wave to at least one of a ground plane of the photoreceptor 12 and the scanner probe 18. For applying the reference wave to the photoreceptor 12, the wave generator 31 is connected to the drum 14 using a suitable connector (such as a system of conductive brushes, not shown.). For applying the reference wave to the scanner probe 18, the square wave generator 31 is connected to the shield electrode 34 (shown in FIG. 2) of the scanner probe 18, provided that a high-voltage DC bias is provided to the shield electrode 36 as well.

A lower end 24 of scanner probe 18 has a smooth surface which is parallel to and positioned above the outer imaging surface of photoreceptor 12 (typically about 100 μm above the outer imaging surface of photoreceptor 12). Time consumed for a section of photoreceptor 12 just charged by charging device 16 to reach scanner probe 18 allows CDSs to form before the CDSs are scanned by scanner probe 18. Charge on photoreceptor 12 is removed with a discharging device 26, such as an erase light, after photoreceptor 12 passes scanner probe 18.

The charge integrator 21 includes circuitry, such as an optoisolator circuit (not shown) having an optocoupled amplifier, for isolating the data acquisition computer 22 from the high voltage probe bias of the scanner probe 18. Optocoupled amplifiers are well known in the electronic art for providing transmission of an electrical signal without a continuous electrical connection by using an electrically driven light source and a light detector which is insulated from the light source. The isolating of the scanner probe 18 from the data acquisition computer 22 allows biasing of the scanner probe 18 to the average surface potential of the photoreceptor 12 rather than biasing of the ground plane of the photoreceptor 12, thereby preventing air breakdown and arcing. The optically coupled amplifier provides the probe signal to data acquisition computer 22 where the probe signal is recorded and/or analyzed.

Figure 3:
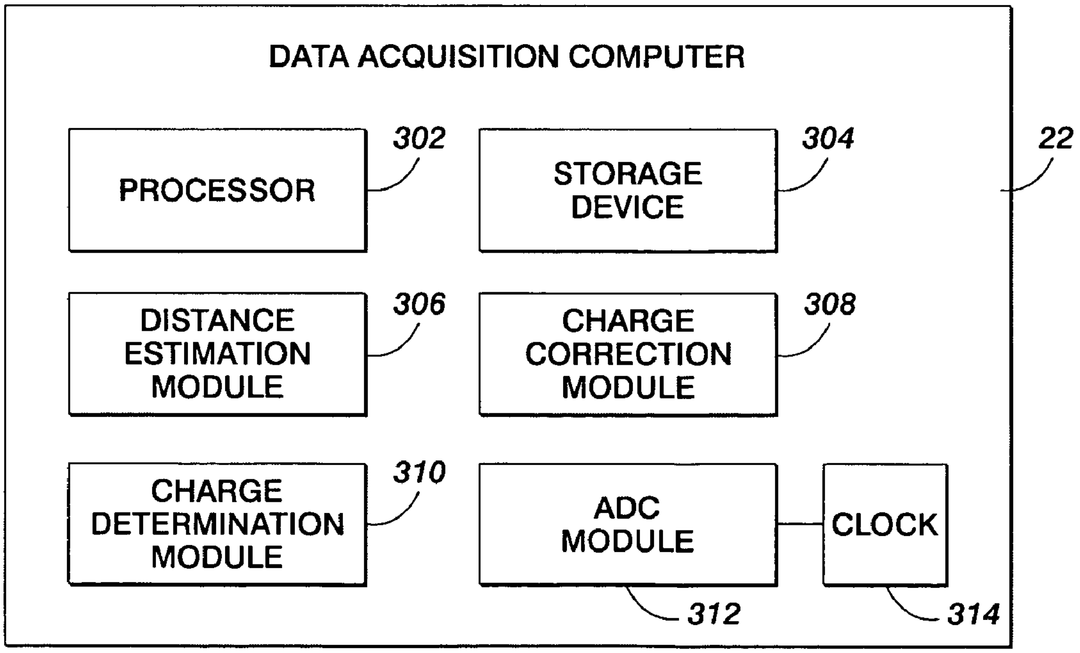
FIG. 3 is a block diagram of a data acquisition computer employed in the scanner system shown in FIG. 1.

The scanner probe 18 senses changes in potential of the photoreceptor 12 and generates a corresponding analog probe signal. The charge integrator 21 processes the probe signal to put the probe signal in condition for processing by the data acquisition computer 22, which includes, for example, amplifying the probe signal. As shown in FIG. 3, the digital acquisition computer 22 includes a processor 302, system clock 314, and an analog to digital conversion (ADC) module 312 for converting the probe signal to a digital signal. The converting process includes sampling the analog probe signal at a predetermined frequency (also referred to as the frequency of the ADC module 312) that is synchronized by clock 314, which corresponds to the operation of encoder 30. In the current example, the clock 314, which may be TTL compatible, generates about 20 000 pulses per revolution. The clock 314 and the encoder pulse need not be synchronized since the clock 314 has many more pulses per revolution than the encoder 30. The digital probe signal, once converted, is in condition for processing by processor 302.

During a scan, the stepping actuator combination 28 (e.g., a stepper motor and micrometer screw combination) moves the scanner probe 18 to a new scan line position and the process is repeated for charging, measuring changes in charge and discharging the photoreceptor 12. In one embodiment of the disclosure, an array of spaced and/or staggered high resolution probes 18 are provided, where the array of high resolution probes 18 simultaneously scan along different respective scan lines.

Figure 2:
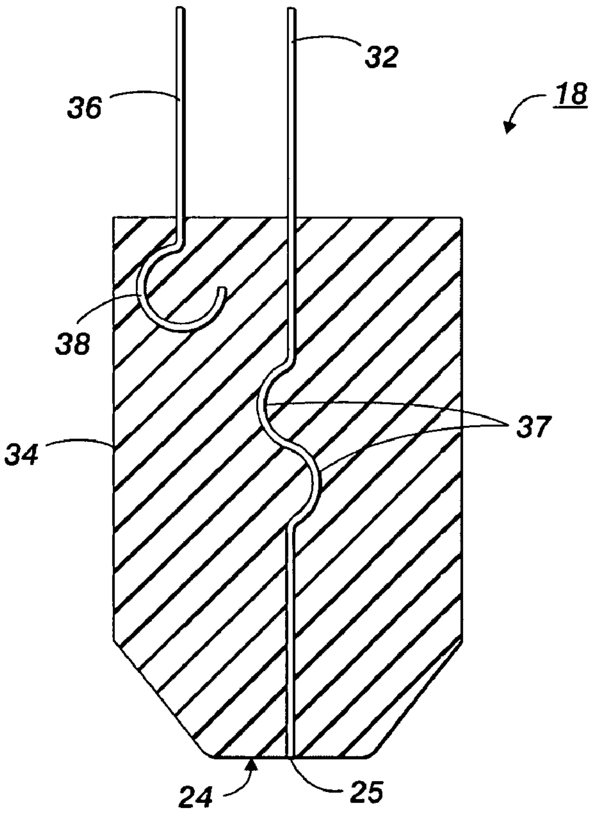
FIG. 2 is schematic sectional side view in elevation of a scanner probe employed in the scanner system shown in FIG. 1.

With reference to FIG. 2, an exemplary scanner probe 18 is shown. The scanner probe 18 includes a central electrode 32 having a lower end 25, and a shield electrode 34. The central electrode 32 and the shield electrode 34 are both formed of a conductive material, such as metal. The central electrode 32 is insulated from the shield electrode 34 by a thin insulative coating. The conductive material of center electrode 32 may be provided as a small diameter wire which is insulated by a very thin material. For example, the conductive material may be enameled, i.e., coated with a thin electrically insulating coating (not shown). Any suitable insulating coating may be utilized. Generally, the insulating coating is a film forming material having a resistivity in excess of about 1013 ohm/cm and a thickness between about 5 micrometers and about 50 micrometers. The cross-section of lower end 25 is circular, having a typical diameter of 113 μm.

Center electrode 32 is embedded in shield electrode 34 which is electrically grounded via ground wire 36. Grounded shield electrode 34 is used as a shield against electromagnetic noise. Changes in potential are sensed by the embedded center electrode 32. Due to the arrangement of the center electrode 32 embedded within the shield electrode 34, the scanner probe 18 is well shielded from external noise and rendered suitably rugged.

A series of small bends 37 in the wire for center electrode 32 and the surrounding of the wire with shield electrode 34 prevents a tendency of the wire to recess into the shield, and in some cases, pull out of the shield entirely. The capacitive coupling between the end 25 of center electrode 32 and the outer imaging surface of photoreceptor 12 is changed as the center electrode 32 begins to recess into the shield thus adversely affecting readings. Ground wire 36 provides an electrical ground connection to the shield electrode 34. The ground wire 36 is provided with a loop 38 to maintain the ground wire's position 36 secured within the shield electrode 34.

The end 24 of scanner probe 18 is perpendicular to the centerline of high resolution probe 18, with the lower end 25 of the electrode 32 and the lower end of shield electrode 34 substantially flush with each other. If center electrode 32 is recessed too far into shield electrode 34, more electric flux will go into the shield electrode 34 rather than onto the center electrode 32 thereby reducing the signal. If the lower end of center electrode 32 extends beyond shield electrode 34, it could scratch photoreceptor 12. Also by polishing, the lower end of center electrode 32 and bottom of shield electrode 34 are at the same plane to achieve good shielding and detection properties. Thus, excessive electric fields are prevented, the possibility of scratching the photoreceptor 12 is minimized, and shielding and detection properties of the scanner probe 18 are maximized.

A bias is applied to the shield electrode 34 by the electrostatic voltmeter probe 15. One may alternatively apply a bias on shield electrode 34 without using an electrostatic voltmeter probe 15, so long as the applied bias is within a predetermined voltage range (+/−300 V in the current example) of the average surface potential on the outer imaging surface of the photoreceptor 12.

The combination of the lower end 25 of the center electrode 32 and the outer imaging surface of photoreceptor 12 forms a small parallel plate capacitor. It is through capacitance formed by the parallel plate capacitor that a charge deficient spot is detected. For illustration purposes, at a typical gap distance of 100 μm between probe end 24 (e.g., the end 25 of center electrode 32) and the outer imaging surface of photoreceptor 12, the capacitance is found to be approximately 1 fF, using the approximate relation:

$$C_{coupling}=A\epsilon_0/d \quad (1)$$

where $C_{coupling}$ is the capacitance induced;

A is the area of the surface at the lower end 25 of the center electrode 32 (acting as one end of a parallel plate capacitor);

$\epsilon_0$ is the permittivity of free space (a physical constant); and d is the gap distance between the capacitor plates formed by the photoreceptor 12 and the scanner probe 18.

In one embodiment, the gap distance is between about 20 micrometers and about 200 micrometers, and in another embodiment between about 50 micrometers and about 100 micrometers. When the gap distance is less than about 20 micrometers, there is increased risk of probe touching the surface which can lead to erroneous results. When the gap distance is greater than about 200 micrometers, the probe sensitivity and resolution may be substantially reduced.

When a charge of 0.1 pC is present, in accordance with (Q=CV) the voltage across the capacitance 1 fF is 100 V on the probe end 24. The surface potential can be determined by using the capacitance-voltage relationship Q=CV, as $$V_{surface}=Qd/A\epsilon_0; \quad (2)$$

where $V_{surface}$ is the surface potential; and

Q is the surface charge.

Equation 1 above gives:

$$C_{coupling}=A\epsilon_0/d, \quad (3)$$

Inverting this equation gives a calibration curve:

$$1/C_{coupling}=(1/A\epsilon_0)d \quad (4)$$

Since V is directly proportional to the gap distance, d, it is important to keep the gap distance d constant during scanning to obtain meaningful results. This is complicated by the fact that the drum 14 on which the photoreceptor 12 is mounted may be slightly eccentric, such eccentricities typically ranging between +/−25 μm. Other mechanical factors that may cause variations in d, include play in bearings associated with the drum 14, play in a tube of the aerodynamic floating device for supplying gas, misalignment of the scanner probe 18, and variations on the surface of the photoreceptor 12. Precise machining of the scanner mechanical hardware, such as the mounting drum 14 and related drum bearings, and reducing vibrations from the stepper motor 11 by selecting a smooth running micro-stepping motor helps to reduce excessive measurement errors due to variations in d.

Distance control system 29 further reduces variations in the gap distance. The distance control system 29 may be an active distance control system having active control equipment, or a passive distance control system. An example of a passive distance control system including an aerodynamically floating device is described in U.S. Pat. No. 6,119,536, which is hereby incorporated by reference in its entirety. However, slight variations in the gap distance may still exist, and a need exists to determine the slight variations in the gap distance and to correct the potential readings for the determined variations. Such variations may be due to changes over time in the tension of a cable for scanner probe 18 and/or an air hose of the aerodynamic floating device, misalignment of the scanner probe 18, eccentricity of the drum 14, shifts in bearings associated with the drum 14, etc. Reproducibility of an initial gap distance is difficult. Accordingly, it is difficult to achieve a desired initial gap distance when replacing the scanner probe 18.

The capacitance between the scanner probe 18 and ground plane of photoreceptor 12 is inversely proportional to the distance between the end 24 of scanner probe 18 and the outer imaging surface of photoreceptor 12. U.S. Pat. No. 6,008,653 describes a method for continuously measuring the gap distance in which a 100 V square wave pulse is applied to a scanner probe synchronously with the data acquisition frequency.

In accordance with the present disclosure, the at least one wave generator 31 applies a reference wave, such as a square wave, to a ground plane of the photoreceptor 12 and/or to the shield electrode 34 of the scanner probe 18. The reference wave is in addition to the potentials applied to the scanner probe 18 and the photoreceptor 12 by the electrostatic probe 15 and the charging device 16, respectively. The frequency of the reference wave is synchronous with the frequency of the ADC module 312, and half the value. For example, if the rate of clock 314 is 20,000 pulses/rev then the frequency of the reference wave is 10,000 pulses/rev and in phase (synchronous) with the clock pulses. Analysis is performed of consecutively sampled points of the scanner probe readings by the scanner probe 18 that correspond to high and low points of the reference wave.

For example, the reference wave is a 100 V square wave. The ADC module 312 acquires samples at the maximum and minimum points of the probe readings that correspond to the square wave. Two consecutively acquired samples provide respective measurements that correspond to the input 0V and 100V points of the square wave. The difference between the amplitude of the two consecutively acquired samples is inversely proportional to the gap distance.

Equation (4) shows a linear relationship between $1/C_{coupling}$ and d which can be used to generate a distance estimation calibration curve. The distance estimation calibration curve is determined by taking a series of readings, such as by using a capacitance bridge to measure the capacitance between the scanner probe 18 and photoreceptor 12 for many values of d, with d incrementally increased by a predetermined fixed amount after each reading. The inverse of the probe readings are plotted against the corresponding gap distance. Experimentally, it has been shown that the plotted points fit to a substantially straight line. The slope of the substantially straight line is determined for calibrating the scanner system 10.

In the present example, the capacitance bridge, which is very accurate, is used offline to calculate primary and secondary parameters (such as determining diameter and area of scanner probe 18, and linearity of the probe readings). Knowing that C=Q/V is true for the reference signal, the amplitude of the reference signal is measured for various known distance increments (where the absolute zero position may be extrapolated).

However, some difficulties may arise taking measurements for extremely small values of d. To compensate, an arbitrary point close to the surface of the photoreceptor sample 12 may be defined to be at d=0 and all other distances may be calculated relative to the artificial point which serves an artificial benchmark and has the effect of introducing a constant offset to all distances. Accordingly, the mapping $d \rightarrow d+\delta$ is applied to the equation of the distance estimation calibration curve. The equation for the distance estimation calibration curve is modified to correct for the offset and becomes:

$$1/C_{coupling}=(1/A\epsilon_0)d+(1/A\epsilon_0)\delta \quad (5)$$

The modified distance estimation calibration curve has the equation of a straight line with a non-zero intercept. Measuring the slope and intercept of the measured calibration line gives values for $(1/A\epsilon_0)$ and δ. Once the quantity $(1/A\epsilon_0)$ is determined, the true distance is determined using Equation (4). Therefore, the distance estimation calibration curve provides an easy method of determining gap distance during a scan operation by measuring the capacitance between the scanner probe 18 and photoreceptor sample 12.

During a scan operation using the scanner system 10, the interval corresponding to the difference between the measurements taken for the 0V and 100V points and the slope determined during calibration of the scanner system 10 is used to determine the gap distance at the point on the photoreceptor 12 currently scanned. The gap distance is determined for each pixel in a 2-D array of pixels where the pixels correspond to respective points scanned on the photoreceptor 12. The correction to the distance determination takes into account the flat plate capacitor characteristic of the combination of the biased scanner probe 18 and the biased photoreceptor 12. However, the purpose of the scan operation is to identify and locate localized and point-like CDSs which may exist on the photoreceptor 12. A further correction is needed to account for the point-like charge of the CDSs.

The data acquisition computer 22, also referred to as computer 22, which is shown in greater detail in FIG. 3, processes a respective probe reading and accesses an appropriate distance estimation calibration curve for determining a corrected distance. Additionally, the computer 22 processes the respective probe reading and the applied reference wave potential for determining the potential of a CDS, where the potential is further adjusted based on the corrected distance and a dimension of the scanner probe 18 (e.g., where the dimension is a radius or diameter), and more specifically the dimension (e.g., radius or diameter) of the center electrode 32 of the scanner probe 18.

The computer 22 includes at least one processor 302, such as a microprocessor, a PC, a handheld computing device, a mobile phone, a mainframe computer, a network of computers, etc. A processor of the at least one processor 302 may be included in one or more networks, such as LAN, WAN, Extranet, the Internet, etc. The processors of the at least one processor 302 may communicate via wired and/or wireless communications. The at least one processor 302 has access to at least one storage device 304, such as RAM, ROM, flash RAM, a hard drive, a computer readable medium, such as a CD-ROM, etc.

The computer 22 further includes a distance estimation software module 306, a charge correction software module 308, and a charge determination module 310. The software modules 306, 308 and 310 each include a respective series of programmable instructions executable by the at least one processor. The series of programmable instructions may be stored on the storage device 304, which is accessible by the at least one processor 302, or transmitted via propagated signals for execution by the at least one processor 302 for performing the functions described herein and to achieve a technical effect in accordance with the disclosure.

The charge determination module 310 calls on the distance estimation module 306 and the charge correction module 308 to determine a corrected distance for a scanned point on the photoreceptor 12 and use the corrected distance to determine if charges are detected that correspond to one or more CDSs. The distance estimation module 306 consults a distance estimation calibration curve, and the charge correction module 308 consults a charge correction curve when analyzing probe readings.

The distance estimation calibration curve is generated by the distance estimation module 306 before beginning an actual scan operation. A calibration test is performed by scanning using test points, where the gap distance is incrementally changed for each test point. The distance estimation module 306 includes an algorithm for executing equation (5) for the test points and generating a corresponding distance estimation calibration curve, which may include determining the slope and intercept of the distance estimation calibration curve for determining $(1/A\epsilon_0)$ and δ.

The charge correction curve is determined using a mathematical model for the particular scanner system 10 being used and the photoreceptor 12 being tested by plugging in the diameter or radius of the center electrode 32 of the scanner probe 18, the photoreceptor thickness and the relative dielectric constant of the photoreceptor 12 into an equation derived from an electrostatic model that accounts for the point-like nature of CDSs and the finite diameter or radius of the scanner probe 18. The electrostatic model and equations derived therefrom are described further below.

FIG. 8 shows an exemplary charge correction curve in which a ratio of gap distance to probe radius ratio is plotted against a corrected charge ratio (charge sensed/total charge) for the case when the photoreceptor 12 thickness (s) is 30 μm, the scanner probe 18 radius (R) is 70 μm and the relative dielectric constant of the photoreceptor 12 (α) is 3.0. The charge induced in the scanner probe 18 decreases as the gap distance, d increases. The corrected distance that corresponds to the point being scanned is input to the charge correction module 308 which accesses the charge correction curve to look up the corrected charge ratio.

The distance estimation calibration curve and the charge correction curve may each be stored, respectively, in storage device 304, such as in the form of a look-up-table (LUT). The distance estimation module 306 and the charge correction module 308 access the storage device 304, for accessing the appropriate curve or LUT. The distance estimation module 306 looks up the corrected distance using the probe readings. The charge correction module 308 looks up the corrected charge ratio value using at least the corrected distance information, the charge measurements (i.e., readings), and values corresponding to the input reference wave. Linear interpolation is performed for deriving information from the respective curve that lies between plotted points or points included in the corresponding LUT. When no corrected distance measurement is known, or distance estimation is not needed, such as due to an ideal scanner system, an uncorrected distance may be input to the charge correction module 308. Alternatively to using the charge correction curve to look up the corrected charge ratio, the corrected charge ratio may be calculated for respective points scanned on the photoreceptor 12 using equations such as equation (22) described further below.

More than one charge correction curve or distance estimation calibration curve may be stored by the at least one storage device 304, and the distance estimation calibration or charge correction curve used during a particular scan operation may be selected based on characteristics of the scan system 10 and/or the photoreceptor 12. Characteristics of the scanner system 10 which may be used for determining which correction curve to select include, for example, probe radius, photoreceptor thickness and photoreceptor dielectric constant.

During a scan of the photoreceptor 12, the reference wave is applied and probe readings are acquired. The distance estimation module 306 applies to the probe readings that correspond to respective points (or pixels) along the photoreceptor 12 as the photoreceptor 12 is scanned. The distance estimation module 306 accesses the distance estimation calibration curve and uses information extracted from the respective probe readings to look up the actual distance information pertaining to the gap distance between the probe 18 and the point being measured on the photoreceptor 12. The information may be extracted from the probe readings using standard numerical interpolation techniques described further below. The distance estimation normalizes the measurements against any instrument gain variation (e.g., drift, etc.) and compensates for distance changes for uniformly distributed charges. However, the corrections performed using the distance estimation module 306 correct for an idealized electrostatic model which does not account for the finite size of the probe and the point-like nature of CDSs which are being searched for.

Next, the charge determination module 310 performs a calculation based on the probe readings for the point being scanned and on the input potential applied by the reference wave. The calculations further include calling on the charge correction module 308 to perform a charge correction algorithm that adjusts the charge determination to account for the finite size of the probe and the point-like nature of CDSs which may be found on the photoreceptor. The charge correction module 308 accesses the charge correction curve or corresponding LUT to look up corrected charge information.

FIGS. 4 and 5 show count results for experimental data for a scan of a photoreceptor. The charge correction module 308 outputs a topographical three dimensional surface model in which localized peaks on the surface model correspond to CDSs. The surface model is visualized as an image in which grayscale intensity levels are proportional to photoreceptor charge amplitudes calculated using data obtained during the scan of the photoreceptor, where darker shading is corresponds to higher potentials (or vice versa). The resultant image is typically a uniform grey image with small dark-grey and black spots (CDS's). If a spot is sufficiently dark (e.g., has a grayscale shading intensity that exceeds a predetermined intensity threshold, which corresponds to a large potential amplitude detected on the photoreceptor) it is counted. Commercially available software spot-counting routines are available for counting the spots.

Points 402 and 502 (depicted as solid circular dots) are plotted to correspond to the number of spots counted per $cm^2$ (referred to as scanner spot counts/$cm^2$) are counted from an image generated using distance estimation provided by the distance estimation module 306. Points 404 and 504 (depicted as open square dots) are plotted to correspond to the scanner spot counts/$cm^2$ counted from an image generated using the distance estimations provided by the distance estimation module 306, as well as using the charge corrections provided by the charge correction module 308, where the image used for generating points 402 and 502, and the image used for generating points 404 and 504 are generated using the same set of measured data. In FIG. 4, the scanner spot counts for points 402 and 404 are plotted for variations in gap distance between the scanner probe 18 and the photoreceptor 12. In FIG. 5, the scanner spot counts for points 502 and 504 are plotted for variations in distance from a starting position on the photoreceptor 12 to the position of the point being scanned along a span of 100 feet (30.48 m) of the photoreceptor 12. A curve 506 corresponding to points 502, and a curve 508 corresponding to points 508 is shown.

While the data plotted is somewhat noisy due to the statistical nature of CDSs in a photoreceptor, the variability in the scanner spot counts is improved for points 404 and 504 which are plotted in accordance with charge correction by the charge correction module 308. In FIG. 4, line 406 shows average scanner spot counts for points 402 over a span of gap distances. Line 408 shows average scanner spot counts for points 404 over a span of gap distances. A greater amount of variability for points 402 relative to line 406 is shown when compared to the variability of points 404 relative to line 408. The non-zero slope for line 408 may be due to a slight CDS footage trend in the photoreceptor 12. In FIG. 5, points 502 and curve 506 are too noisy to be meaningful, while points 504 and curve 508 suggest a linear trend as a function of footage of the photoreceptor 12.

Figure 6:
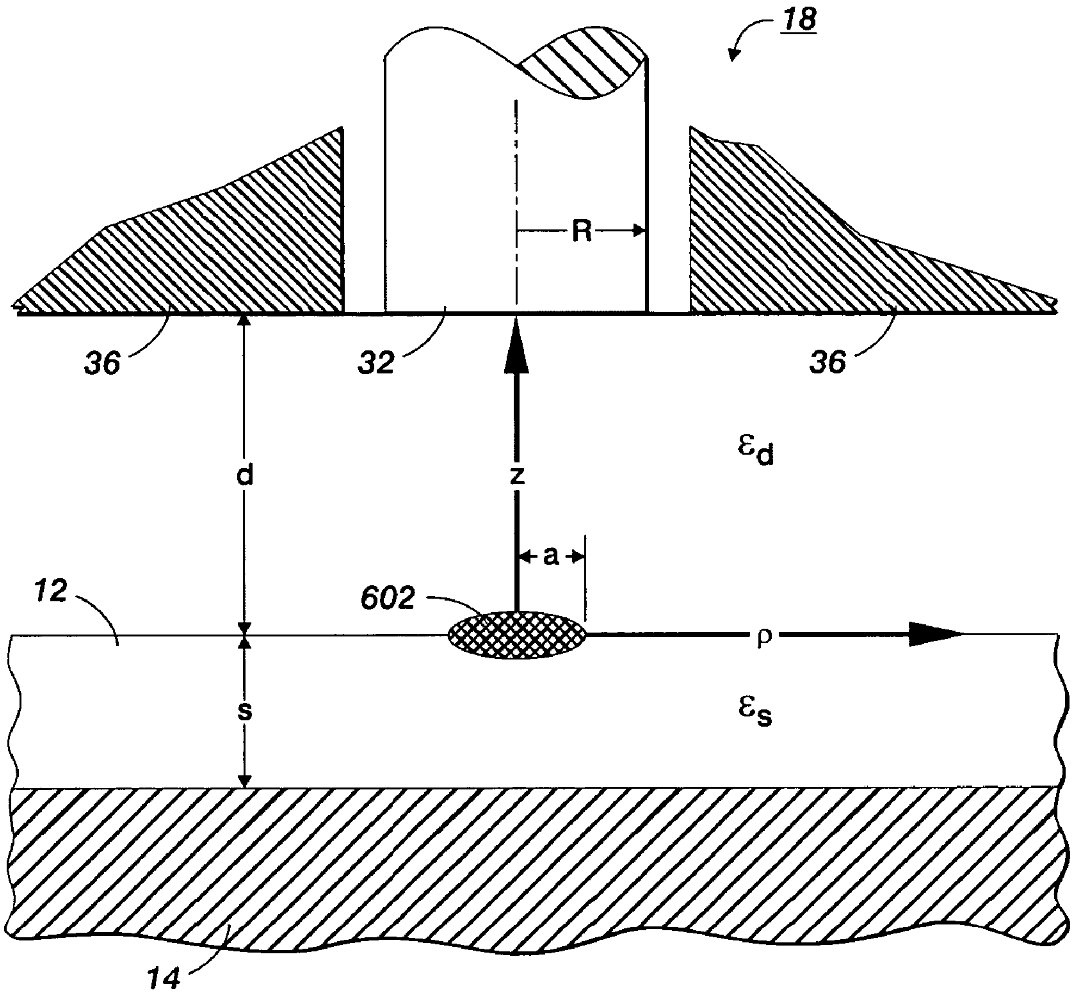
FIG. 6 is a diagram of a geometry of a problem of a charge induced by a uniformly charged circular patch.
Figure 7:
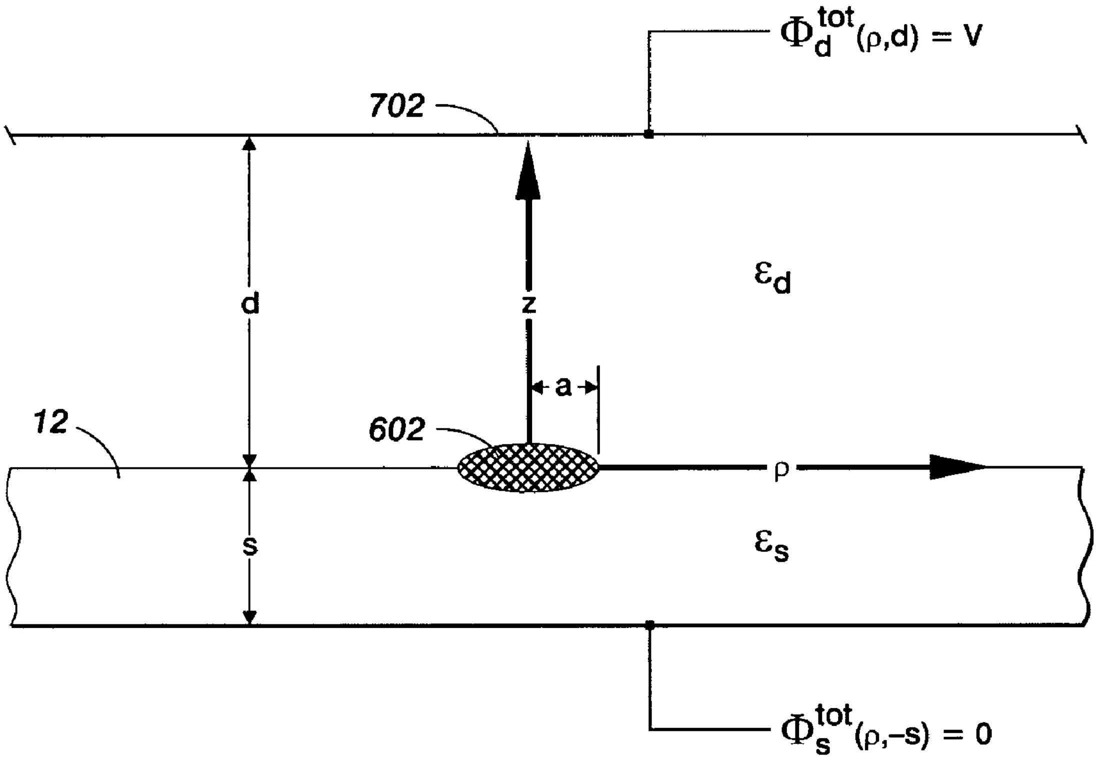
FIG. 7 is a diagram of an electrostatic model of the problem of the charge induced by the uniformly charged circular patch.

With reference to FIGS. 6 and 7, derivation of the charge correction curve is described. A model of the electrostatics of a CDS event is shown in FIG. 6. The CDS charge is modeled as a point charge 600 inside a parallel plate capacitor, where the point charge 600 rests on a layer of dielectric material provided on the photoreceptor 12 whose thickness is denoted by s. Charges of opposite polarity are induced in the top and bottom plates of the capacitor. The center electrode 32 of scanner probe 18 is kept at a height d above the surface of the photoreceptor 12, with an (air) gap formed between the scanner probe 18 and the surface of the photoreceptor 12, where d is the air gap distance. The permittivity of the (air) gap is denoted by $\in_d$ and can be taken to be $\in_0$ (i.e., the permittivity of a vacuum as in the case of Equation (1)). The photoreceptor 12 is represented by a dielectric layer of thickness s and permittivity of the dielectric $\in_s$. The core of the center electrode 32 has a diameter 2R, and is separated from the shield electrode 34 by a negligible distance. In the model, the shield electrode 34 is taken to be infinite in extent.

In FIG. 6, a geometry of the problem of charge induced by a uniformly charged circular patch 602 with a dimension (e.g., radius) "a" and having a uniform charge density σ is shown. The point charge limit can be taken after the solution has been obtained for this case by taking the limit $a \rightarrow 0$ while keeping the total charge on the patch $\pi a^2\sigma$ fixed. The total charge at the charge of the CDS can be identified, i.e. $q_{CDS}=\pi a^2\sigma$. In the simple example, the scanner probe 18 and the photoreceptor 12 are grounded. In a case in which the scanner probe 18 and/or the photoreceptor 12 are kept at a non-zero potential, a correction must be added to the calculated solution for the non-homogeneous uniform boundary condition.

Since the gap between the core of the center electrode 32 and the shield electrode 34 is small, it is assumed that the scanner probe 18 can be modeled by a single planar electrode. Also, as a further generalization, this electrode is modeled to be kept at a potential V, rather than being grounded, as this does not greatly increase the complexity of the problem. The electrostatic model of the problem is shown in FIG. 7. FIG. 7 differs from FIG. 6 in that in FIG. 7 the actual probe structure is replaced by a single planar electrode 702, and the single planar electrode 702 is kept at a potential V, rather than being grounded.

A cylindrical coordinate system with its origin at the centre of the charged disc is used for obtaining the solution to the electrostatic problem. If $\Phi_d^{tot}(\rho,z)$ is the potential in the region between the scanner probe 18 and the photoreceptor 12, and $\Phi_s^{tot}(\rho,z)$ is the potential within the photoreceptor 12, the electrostatic problem is defined by the following equations:

$$\nabla^2 \Phi_{s,d}^{tot} = 0 \quad (6)$$

$$\Phi_s^{tot}(\rho, -s) = 0 \quad (7)$$

$$\Phi_d^{tot}(\rho, d) = V \quad (8)$$

and $$\varepsilon_s \frac{\partial \Phi_s^{tot}(\rho, 0)}{\partial z} - \varepsilon_d \frac{\partial \Phi_d^{tot}(\rho, 0)}{\partial z} = \sigma\theta(a-\rho) \quad (9)$$

In Equation (9) the derivatives must be taken just above (below) the dielectric interface at z=0 and θ(x) is the Heaviside step function defined by:

$$\theta(x) = \begin{cases} 1 & \text{for } x > 0 \\ 0 & \text{for } x < 0 \end{cases} \quad (10)$$

Equation (9) specifies that the normal component of the displacement field is continuous across the dielectric interface if ρ>a, and discontinuous by σ if ρ<a. In order to accommodate the inhomogeneous uniform boundary condition of the scanner probe 18, the principle of linear superposition is used and the problem is split into two sub-problems. The first sub-problem corresponds to the uniform boundary condition specified by Equation (8), without the charged disc, while the second sub-problem has both electrodes grounded, but includes the boundary conditions in Equation (9), i.e., the second sub-problem takes into account the presence of the disc of charge. The solutions to the first and second sub-problems, respectively, are denoted as $u_{s,d}(z)$ and $\Phi_{s,d}(\rho,z)$, in first and second regions, respectively (e.g., inside and outside the photoreceptor 12, respectively). The solutions of the first and second sub-problems are related to the original problem by:

$$\Phi_{s,d}^{tot}(\rho,z)=u_{s,d}(z)+\Phi_{s,d}(\rho,z) \quad (11)$$

The solutions $u_{s,d}(z)$ and $\Phi_{s,d}(\rho,z)$ are given by:

$$u_d(z) = V\frac{z + (\varepsilon_d/\varepsilon_s)s}{d + (\varepsilon_d/\varepsilon_s)s} \quad (12)$$

$$u_s(z) = V\frac{z + s}{s + (\varepsilon_s/\varepsilon_d)d} \quad (13)$$

$$\Phi_d(\rho, z) = \sigma a \int_0^\infty dk \frac{\sinh[k(d-z)]}{\sinh(kd)} \frac{J_1(ka)J_0(k\rho)}{k[\varepsilon_d \coth(kd) + \varepsilon_s \coth(ks)]} \quad (14)$$

$$\Phi_s(\rho, z) = \sigma a \int_0^\infty dk \frac{\sinh[k(z+s)]}{\sinh(ks)} \frac{J_1(ka)J_0(k\rho)}{k[\varepsilon_d \coth(kd) + \varepsilon_s \coth(ks)]} \quad (15)$$

where $J_0(x)$ and $J_1(x)$ are the Bessel functions. If the source is a point charge $q_{CDS}$, Equations (12) and (8) remain unaffected, but Equations (14) and (15) become:

$$\Phi_d(\rho, z) = \frac{q_{CDS}}{2\pi} \int_0^\infty dk \frac{\sinh[k(d-z)]}{\sinh(kd)} \frac{J_0(k\rho)}{\varepsilon_d \coth(kd) + \varepsilon_s \coth(ks)} \quad (16)$$

$$\Phi_d(\rho, z) = \frac{q_{CDS}}{2\pi} \int_0^\infty dk \frac{\sinh[k(z+s)]}{\sinh(ks)} \frac{J_0(k\rho)}{\varepsilon_d \coth(kd) + \varepsilon_s \coth(ks)} \quad (17)$$

where the limit of a→0, while keeping $q_{CDS}=\pi a^2\sigma$ fixed.

Knowing the total potential in the air gap, $\Phi_d^{tot}(\rho,z)$, $\sigma_d(\rho)$, the charge density induced in the scanner probe 18 can be calculated. For the point charge case the charge density is given by:

$$\sigma_d(\rho) = \varepsilon_d \frac{\partial \Phi_d(\rho, z)}{\partial z}\bigg|_{z=d} = \frac{\varepsilon_d V}{d + \alpha s} - \frac{q_{CDS}}{2\pi} \int_0^\infty dk \frac{k}{\sinh(kd)} \frac{J_0(k\rho)}{\coth(kd) + \alpha \coth(ks)} \quad (18)$$

where:

$$\alpha=\epsilon_s/\epsilon_d \quad (19)$$

in which α is the relative dielectric constant of the photoreceptor 12 with respect to that of the air gap.

The total charge induced within an area defined by R (i.e., in the core of the scanner probe 18) is obtained by integrating the charge density in Equation (17):

$$q_{probe}(R) = 2\pi \int_0^R d\rho\, \rho\sigma_d(\rho) \quad \frac{\pi R^2 \varepsilon_d}{d + \alpha s} V - q_{CDS} R \int_0^\infty dk \frac{J_1(kR)}{\sinh(kd)[\coth(kd) + \alpha \coth(ks)]} \quad (20)$$

During normal operation of the scanner probe 18, the photoreceptor 12 is charged to some potential and the same voltage is applied to the upper electrode in FIG. 7. The first term in Equation (20) drops out as, effectively, V=0. The charge induced in the scanner probe 18 may be expressed as a fraction of the total charges (i.e., the charges induced in the central electrode 32 and the shield electrode 34), which is the charge density induced in the tip of the scanner probe 18, and is the total charge induced in the single planar electrode 702 shown in FIG. 7. The total charge is given by:

$$q_{total} = -\frac{q_{CDS}}{1 + \alpha d/s} \quad (21)$$

Introducing Equation (21) into Equations (16, 17, 18, and 20) captures the critical dependence on the finite size of the scanner probe 18 and eliminates the appearance of the unknown charge $q_{CDS}$ in terms of the $q_{total}$ which is more easily measured. In this case the scaled scanner probe 18 charge may be written as:

$$\frac{q_{probe}}{q_{total}} = -\left(1 + \frac{\alpha d}{s}\right) R \int_0^\infty dk \frac{J_1(kR)}{\sinh(kd)[\coth(kd) + \alpha \coth(ks)]} \quad (22)$$

where $q_{probe}$ is the total charge induced in the tip of the scanner probe 18;

- k is the variable of integration, R is a dimension (e.g., radius or diameter) of the center electrode 22 of the scanner probe 18;
- d is the corrected distance provided by the distance estimation module 306; and
- s is the dielectric thickness, and α is the dielectric constant of the photoreceptor 12.

Accordingly, Equation (22) is used for generating the charge correction curve (such as the exemplary correction curve 802 shown in FIG. 8), or for plugging in the known values for determining $q_{probe}$.

During a scan operation charge correction is performed as follows: Charges (of opposite polarity) are induced in the top and bottom plates of the capacitor formed by the induced potential in the scanner probe 18 and the ground plane of the photoreceptor 12. A square wave voltage signal (e.g., a 50 $V_{pp}$ square wave) is applied to the bottom plate (e.g., ground plane) of the photoreceptor 12 and/or to the shield probe 34 (e.g., the floating ground) of the scanner probe 18. The scanner probe 18 senses the induced charge which is then amplified by the amplifier of the charge integrator 21 and is output from amplifier as $V_{out}$ where the amplifier is a charge-to-voltage amplifier having a reciprocal gain G. $V_{out}$ includes $V_{sqwave}^{meas'd}$ which is due to the square wave applied to the ground plane of the photoreceptor 12 (and/or the floating ground of the scanner probe 18), and $V_{CDS}^{meas'd}$, which are signals caused by CDSs on the photoreceptor 12, where $V_{CDS}$ may be superimposed on $V_{sqwave}^{meas'd}$.

The analog $V_{out}$ signals from the amplifier are sampled by the ADC module 312 of the computer 22. The sampling is synchronized with the frequency of the square wave signal, such as to have a frequency that is at least twice the frequency of the square wave, where at least one sample is obtained for each of the high and low portions of respective periods of the square wave. With reference to FIG. 9, an exemplary signal $V_{out}$ signal 902 (solid line) is shown broken including components $V_{sqwave}^{meas'd}$ and $V_{CDS}^{meas'd}$. The $V_{CDS}^{meas'd}$ signal component 904 (dashed line) of $V_{out}$ is shown as a uniform potential. Sampled potential readings are taken at $V_0$, $V_1$ and $V_2$. The following computations are made using an interpolation technique for two or more points for separating out the $V_{sqwave}^{meas'd}$ and $V_{CDS}$ components of $V_{out}$. In the equations below, the polarities of the charges are not shown for simplicity, and absolute values are used. The polarities of the charges may be determined from the context they are used in. The distance estimation module 306 performs the computations as follows:

$$V' \approx (V_0+V_2)/2; \tag{23}$$

the amplitude of the square wave $=V_{sqwave}^{meas'd} \approx |V'-V_1|$ $$V_{CDS}^{meas'd} \approx \tfrac{1}{2}(V'-V_1)$$

Using a previously prepared distance estimation calibration curve, distance estimation module 306 looks up the corrected gap distance that correlates to the computed amplitude of the square wave. The square wave signal further acts as a calibration signal to normalize $V_{CDS}^{meas'd}$ and make $V_{CDS}^{meas'd}$ independent of the gap distance, assuming that $V_{CDS}$ is due to a uniformly distributed charge below the scanner probe 18. However, CDSs are point-like and do not have uniformity of charge. Accordingly, the corrected distance is provided to the charge correction module 308 which adjusts charge for measured CDSs, taking into account the point-like nature of the individual CDSs.

The charge correction curve accessed by the charge correction module 308 is expressed as a known function $f$ as follows:

$$\frac{q_{probe}}{q_{total}} = f\left(\frac{s}{R}; \frac{d}{R}\right) \tag{24}$$

Equation (24) expresses the fact that not all of the charge induced in the top plate of the capacitor is seen by the scanner probe 18 (see Equations (21) and (22)). Accordingly, $$q_{probe} = \frac{q_{CDS}}{1+\frac{\alpha d}{s}} f\left(\frac{s}{R}; \frac{d}{R}\right) = G \cdot V_{CDS}^{meas'd} \tag{25}$$

where:

$V_{CDS}^{meas'd}$ is the measured CDS potential which is calculated from probe readings in accordance with Equation set (23); and G is the instrumentation specific amplifier reciprocal gain of the amplifier of the charge integrator 21.

The overall probe capacitance is written as:

$$\frac{1}{C_{probe}} = \frac{1}{C_{air}} + \frac{1}{C_{PR}} = \frac{1}{\varepsilon_0 A}\left(d + \frac{s}{\kappa_s}\right) \tag{26}$$

where:

$K_s = \epsilon_s/\epsilon_0$ is the dielectric constant of the photoreceptor;

$C_{probe}$ is the capacitance induced in the probe;

$C_{air}$ is the capacitance induced in the air gap; and $C_{PR}$ is the capacitance induced in the photoreceptor.

The square wave also induces charges in the scanner probe 18. Because the charges from the square wave are uniformly distributed below the scanner probe 18, the standard capacitance relation is used to calculate the measured square wave voltage:

$$V_{sqwave}^{in} = \frac{1}{C_{probe}} \cdot q_{sqwave} = \frac{1}{C_{probe}} \cdot G \cdot V_{sqwave}^{meas'd} \tag{27}$$

$$d = \frac{\varepsilon_0 A V_{sqwave}^{in}}{G \cdot V_{sqwave}^{meas'd}} - \frac{s}{\kappa_s} \tag{28}$$

where:

$V_{sqwave}^{in}$ is the known amplitude of the applied square wave; and $V_{sqwave}^{meas'd}$ is the amplitude of the sensed square wave as computed from the sampled potential values.

Equations (25), (26) and (27) are combined as follows:

$$\frac{V_{CDS}^{meas'd}}{V_{sqwave}^{meas'd}} = \frac{q_{CDS}}{1+\alpha d/s} \frac{1}{C_{probe} V_{sqwave}^{in}} f\left(\frac{s}{R}; \frac{d}{R}\right) \tag{29}$$

$$\frac{V_{CDS}^{meas'd}}{V_{sqwave}^{meas'd}} = \frac{q_{CDS}}{V_{sqwave}^{in}} \frac{d}{A\varepsilon_0\kappa_s} f\left(\frac{s}{R}; \frac{d}{R}\right) = \frac{q_{CDS}}{C_{PR} V_{sqwave}^{in}} f\left(\frac{s}{R}; \frac{d}{R}\right) \tag{30}$$

where it is assumed the dielectric constant of air is unity and thus α in Equation (19) is the dielectric constant of the photoreceptor material, $\kappa_s$. The simple capacitance relationship is used to correlate a potential $V_{CDS}$ with $q_{CDS}$:

$$V_{CDS} = \frac{q_{CDS}}{C_{PR}} = \frac{V^{in}_{sqwave}}{V^{meas'd}_{sqwave}} \cdot \frac{V^{meas'd}_{CDS}}{f\left(\frac{s}{R}; \frac{d}{R}\right)} \tag{31}$$

where $$f\left(\frac{s}{R}; \frac{d}{R}\right)$$

is the charge correction curve accessed and/or determined by charge correction module 308.

If the geometry is such that $$f\left(\frac{s}{R}; \frac{d}{R}\right) \approx 1,$$

then Equation (31) reduces to an equation used by the charge determination module 310 without calling the charge correction module 308. However, in order to adjust for point-like nature of CDSs, the charge determination module 310 calls on the charge correction module to apply function $f$.

In an ideal scanner system in which the distance air gap does not vary, the distance and charge corrections may not be needed. However, as shown in the plotted results shown in FIGS. 4 and 5, application of the distance and charge corrections provide much more coherent and meaningful data, when even very slight air gap distance variations exist during a scan operation.

Once $q_{probe}$ is determined, the true value of $q_{CDS}$, e.g., the charge for a CDS on the photoreceptor 12 is determined. Next, $V_{CDS}$ may be determined using $C_{PR}=q_{CDS}/V_{CDS}$. The values calculated for $V_{CDS}$ are plotted as an image. A counting routine counts spots that correspond to $V_{CDS}$ readings that exceed a predetermined threshold value. The total counts per area for the photoreceptor 12 may be compared to a stable control sample for determining stability of the photoreceptor 12.

It will be appreciated that various of the above-disclosed and other features and functions, or alternatives thereof, may be desirably combined into many other different systems or applications. For example, chargeable surfaces, other than a photoreceptor, may be scanned by the scanner system 10 for locating point-like charge defects on the chargeable surface. The claims can encompass embodiments in hardware, software, or a combination thereof. Also that various presently unforeseen or unanticipated alternatives, modifications, variations or improvements therein may be subsequently made by those skilled in the art which are also intended to be encompassed by the following claims.

The invention claimed is:

1. A contactless system for detecting charge defect spots (CDSs) on a chargeable surface comprising:

first circuitry for charging the chargeable surface to receive and hold a first voltage charge;

a scanner probe having a probe surface, the probe surface being displaced a distance from the chargeable surface, and having a diameter;

second circuitry for biasing the scanner probe to a second voltage charge within a predetermined voltage threshold of the first voltage charge, wherein a parallel plate capacitor is established with the chargeable surface and a dielectric substance between the scanner probe surface and the chargeable surface, wherein the scanner probe reads potentials associated with charges induced from the applied charges and any CDSs on the chargeable surface including sensing the potentials and generating a signal corresponding to the sensing;

third circuitry for applying a reference charge to at least one of the scanner probe and the chargeable surface;

a processor; and a charge determination module including programmable instructions executable by the processor for determining the potential of a CDS on the chargeable surface based on the scanner probe readings and at least one of the applied charges, including correcting for a non-uniform charge distribution caused by a point-like nature of the CDS on the chargeable surface;

wherein the correcting comprises adjusting the determined potential of the CDS based on the diameter of the scanner probe and the distance from the scanner probe surface to the chargeable surface at a location where the chargeable surface is being scanned.

2. The scanning system in accordance with claim 1, wherein the adjusting is further based on a thickness of the dielectric substance.

3. The scanning system in accordance with claim 1, further comprising:

a mechanism for establishing relative movement between the scanner probe and the chargeable surface for scanning the chargeable surface for CDSs as the chargeable surface and the scanner probe move relative to one another; and a device for maintaining the distance between the scanner probe surface and the chargeable surface constant as the relative movement is established between the scanner probe and the chargeable surface.

4. The scanning system in accordance with claim 3, further comprising a distance correction module including programmable instructions executable by the processor for determining the distance between the scanner probe surface and the chargeable surface at the location where the chargeable surface is being scanned based on the scanner probe readings and a previously generated calibration curve.

5. The scanning system in accordance with claim 1, wherein the chargeable surface is a photoreceptor imaging surface of a xerographic system.

6. The scanning system in accordance with claim 1, wherein the reference charge is a square wave signal.

7. The scanning system in accordance with claim 6, further comprising sampling circuitry for sampling the scanner probe readings, wherein the sampling frequency is twice the frequency of the square wave.

8. A method for detecting charge defect spots (CDSs) on a chargeable surface comprising:

charging the chargeable surface to receive and hold a first voltage charge;

spacing a surface of a scanner probe a distance from the chargeable surface, the scanner probe having a diameter;

biasing the scanner probe to a second voltage charge within a predetermined voltage threshold of the first voltage charge, wherein a parallel plate capacitor is established with the chargeable surface and a dielectric substance between the scanner probe and the chargeable surface;

reading with the scanner probe potentials associated with charges induced from the applied charges and any CDSs on the chargeable surface including sensing the potentials and generating a signal corresponding to the sensing;

applying a reference charge to at least one of the scanner probe and the chargeable surface; and determining the potential of a CDS on the chargeable surface based on the scanner probe readings and at least one of the applied charges comprising:

correcting for a non-uniform charge distribution caused by a point-like nature of the CDS on the chargeable surface comprising:

adjusting the determined potential of the CDS based on the diameter of the scanner probe and the distance from the scanner probe surface to the chargeable surface at a location where the chargeable surface is being scanned.

9. The scanning system in accordance with claim 8, wherein the adjusting is further based on a thickness of the dielectric substance.

10. The method in accordance with claim 8, further comprising establishing relative movement between the scanner probe and the chargeable surface for scanning the chargeable surface for CDSs as the chargeable surface and the scanner probe move relative to one another; and maintaining a constant distance between the scanner probe surface and the chargeable surface as the relative movement is established between the scanner probe and the chargeable surface.

11. The method in accordance with claim 10, further comprising determining the distance between the scanner probe surface and the chargeable surface at the location where the chargeable surface is being scanned based on the scanner probe readings and a previously generated calibration curve.

12. The method in accordance with claim 8, wherein the chargeable surface is a photoreceptor imaging surface of a xerographic system.

13. The method in accordance with claim 8, wherein the reference charge is a square wave signal.

14. The method in accordance with claim 13, further comprising sampling the scanner probe readings, wherein the sampling frequency is twice the frequency of the square wave.

15. A contactless scanning system for detecting charge defect spots (CDSs) on a photoreceptor comprising:

first circuitry for charging the photoreceptor to receive and hold a first voltage charge;

a scanner probe having a probe surface, the probe surface being displaced a distance from the photoreceptor, and having a diameter;

second circuitry for biasing the scanner probe to a second voltage charge within a predetermined voltage threshold of the first voltage charge, wherein a parallel plate capacitor is established with the photoreceptor and a dielectric substance between the scanner probe surface and the photoreceptor, wherein the scanner probe reads potentials associated with charges induced from the applied charges and any CDSs on the photoreceptor, including sensing the potentials and generating a signal corresponding to the sensing;

third circuitry for applying a reference charge to at least one of the scanner probe and the photoreceptor;

a processor; and a charge determination module including programmable instructions executable by the processor for determining the potential of a CDS on the photoreceptor based on the scanner probe readings and at least one of the applied charges, including correcting for a non-uniform charge distribution caused by a point-like nature of CDSs on the photoreceptor;

wherein the correcting comprises adjusting the determined potential of the CDS based on the diameter of the scanner probe, a thickness of the dielectric substance, and the distance from the scanner probe surface to the chargeable surface at a location where the chargeable surface is being scanned.

16. The scanning system in accordance with claim 15, further comprising:

a mechanism for establishing relative movement between the scanner probe and the photoreceptor for scanning the photoreceptor for CDSs as the photoreceptor and the scanner probe move relative to one another; and a device for maintaining the distance between the scanner probe surface and the photoreceptor constant as the relative movement is established between the scanner probe and the photoreceptor.

17. The scanning system in accordance with claim 16, further comprising a distance correction module including programmable instructions executable by the processor for determining the distance between the scanner probe surface and the photoreceptor at the location where the photoreceptor is being scanned based on the scanner probe readings and a previously generated calibration curve.

18. The scanning system in accordance with claim 15, wherein the reference charge is a square wave signal.

19. The scanning system in accordance with claim 18, further comprising sampling circuitry for sampling the scanner probe readings, wherein the sampling frequency is twice the frequency of the square wave.

* * * * *